United States Patent [19]

Dalton, Jr.

[11] Patent Number: 4,641,094

[45] Date of Patent: Feb. 3, 1987

[54] MAGNETOMETER CIRCUIT FOR MEASURING THE PERIOD OF BEAT FREQUENCY MAXIMA

[76] Inventor: Murphy L. Dalton, Jr., 6035 Aberdeen St., Dallas, Tex. 75230

[21] Appl. No.: 600,955

[22] Filed: Apr. 16, 1984

[51] Int. Cl.$^4$ .................. G01R 33/20; G01V 3/14
[52] U.S. Cl. .................................. 324/302; 324/260; 324/328
[58] Field of Search .............. 324/302, 301, 328, 260, 324/304, 77 A, 253–255, 329, 236, 239; 307/234, 522, 518, 362; 328/111, 109, 140

[56] References Cited

U.S. PATENT DOCUMENTS

| | | | |
|---|---|---|---|
| 3,973,191 | 8/1976 | Zabler .................................. | 324/236 |
| 4,162,453 | 7/1979 | Rudolph ............................... | 328/111 |
| 4,260,949 | 4/1981 | Dalton, Jr. .......................... | 324/302 |
| 4,293,815 | 10/1981 | West et al. .......................... | 324/254 |

*Primary Examiner*—Stephen A. Kreitman
*Assistant Examiner*—Scott M. Oldham
*Attorney, Agent, or Firm*—Richards, Harris, Medlock & Andrews

[57] ABSTRACT

A conventional magnetometer produces an output signal (10) which comprises a series of pulses (12, 14, 16). Each of these pulses has a beat frequency maximum. These pulses are input to a comparator (50) which makes a comparison to a threshold voltage $V_0$ to produce a bi-level detected signal at a line (62). The detected signal is input to an integrator (52) which produces a series of pulses (78, 80, 82) corresponding respectively with the magnetometer output signal pulses (12, 14, 16). The two states of the detected signal corresponding to positive and negative integration. The time period for the positive integration is proportional to the beat frequency maximum time width period for the corresponding magnetometer output signal pulse. Thus the integrated pulses (78, 80, 82) have an amplitude which is a measure of the maxima time width periods for the corresponding magnetometer signal pulses.

6 Claims, 4 Drawing Figures

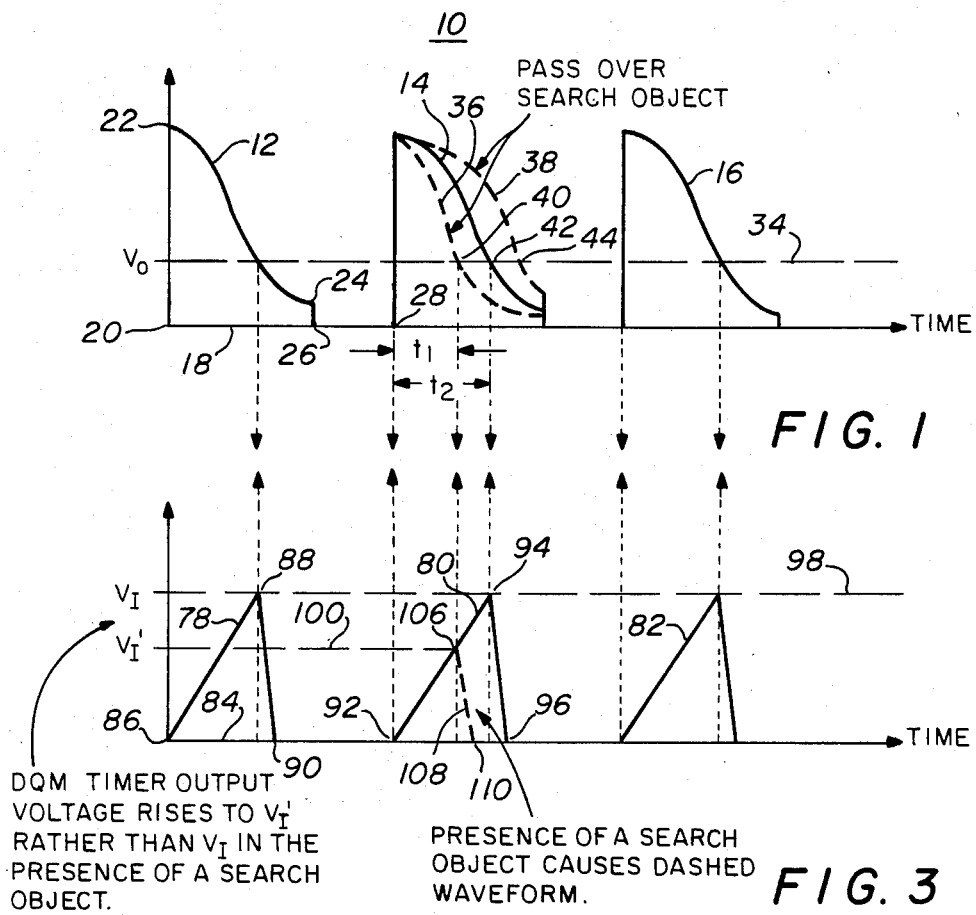
FIG. 1
FIG. 3
DQM TIMER OUTPUT VOLTAGE RISES TO $V_I'$ RATHER THAN $V_I$ IN THE PRESENCE OF A SEARCH OBJECT.
PRESENCE OF A SEARCH OBJECT CAUSES DASHED WAVEFORM.
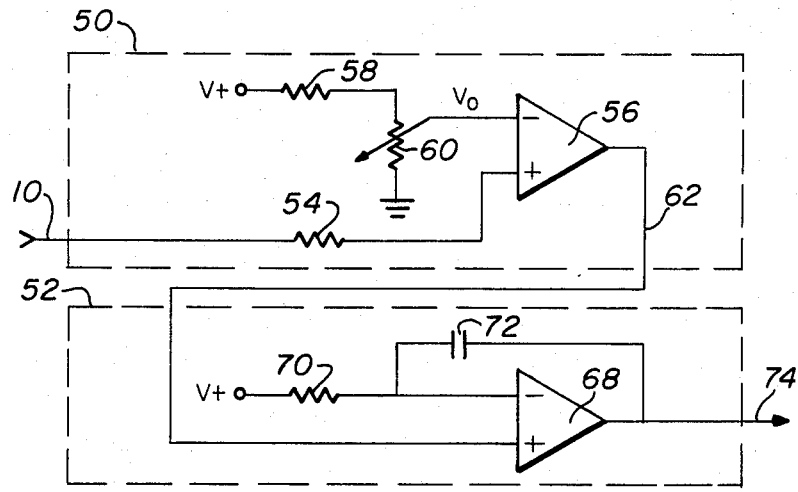
FIG. 2

4,641,094

MAGNETOMETER CIRCUIT FOR MEASURING THE PERIOD OF BEAT FREQUENCY MAXIMA

TECHNICAL FIELD

The present invention pertains in general to the field of magnetometers and in particular to the measurement of beat frequency maxima produce by a proton magnetometer.

BACKGROUND OF THE INVENTION

To the system disclosed in the applicant's prior U.S. Pat. Nos. 4,126,823 and 4,260,949, applicant herein adds a timer referred to as a delayed quasi-minimum timer or DQM Timer. There takes place a measurement of the time interval from the start of the beat frequency waveform to some subsequent designated beat minimum. The measurement to the first minimum is the most sensitive.

The present invention provides important advantages. For instance, sensitivity is enhanced by making a measurement of the time difference between the moment of occurrence of a no-search-object beat minimum and the different moment of occurrence of the same beat minimum shifted in time by the presence of an object of the search, a technique based upon second differential magnetometry.

The no-search-object beat is effectively infinitely far out in time in prior art systems. That is, the prior art utilized first differential magnetometry. By way of example, the prior art may be taken as contained in an article entitled "A Gradient Magnetometer Using Proton Free-Precession" a journal article by M. J. Aitken and M. S. Tite, *Journal of Scientific Instruments*, Vol. 39, p. 625 (1962).

A necessary but not sufficient condition for performing second differential measurements on prior art circuits is the introduction of a constant beat frequency as their no-search-object signal. However, prior art devices cannot cope with a catastrophic limitation, namely the lack of reproducibility of peak precession voltages from one polarization phase to the next. Thus, reproducibility on the part of prior art systems is widely considered to present a difficult problem, even if the prior art had recognized the value of and had introduced a constant beat frequency as the no-search-object signal.

The present invention is directed to improving sensitivity and capabilities of a second differential proton magnetometer, the specific type of differential magnetometer associated with applicant's previous patents.

SUMMARY OF THE INVENTION

A selected embodiment of the present invention comprises a magnetometer circuit for use in a magnetic field detector having polarizable bodies in spaced apart relation, each body having a coil wound thereabout for receiving periodic polarizing current pulses, the coils connected to produce a beat frequency signal having a response pulse following each of the current pulses, each response pulse having a maxima time related to the difference in magnetic fields at the bodies. The circuit includes apparatus for threshold detecting the beat frequency signal pulses to produce a detected signal having a first voltage state when the beat frequency signal pulse exceeds a selected threshold voltage and having a second voltage state when the beat frequency signal pulse is less than the threshold voltage. The circuit further includes apparatus for timing the duration of the first voltage state for each of the beat frequency signal pulses wherein the duration is indicative of the presence or absence of a search object in the region of the magnetic field detector.

BRIEF DESCRIPTION OF THE DRAWINGS

For a more complete understanding of the present invention and the advantages thereof, reference is now made to the following description taken in conjunction with the accompanying drawings in which:

FIG. 1 is an illustration of a magnetometer output signal as a function of time;

FIG. 2 is a Delayed Quasi Minimum (DQM) timer circuit for use in accordance with the present invention;

FIG. 3 is an illustration of the DQM timer circuit output as a function of time which serves to indicate the presence or absence of search objects in the field of a magnetic field detector.

DETAILED DESCRIPTION

Figure 4:
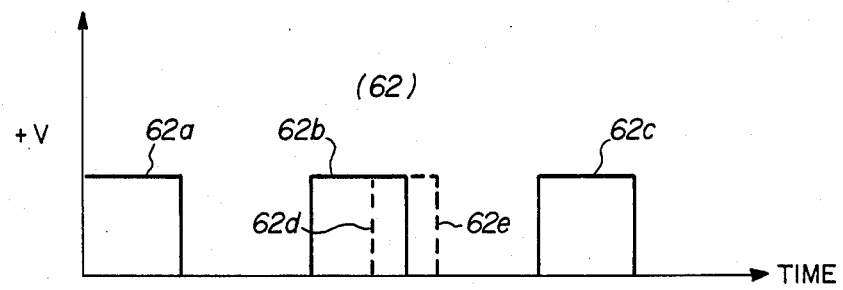
FIG. 4 is a signal waveform illustrating a detected signal produced by a threshold detector.

Applicant's prior U.S. Pat. Nos. 4,126,823 and 4,260,949 are incorporated herein by reference to illustrate a magnetometer which includes a magnetometer circuit for use in conjunction with the present invention.

In applicant's prior U.S. Pat. No. 4,260,949 at FIG. 4, there is shown an output circuit for the magnetometer described therein. The output signal for the magnetometer is taken at the junction of resistor 206 and meter 208. This is termed the magnetometer output signal and is shown in FIG. 1 and noted by the reference numeral 10. The signal 10 comprises a series of pulses illustrated as pulses 12, 14 and 16. Each pulse is produced following a current pulse that polarizes the magnetic field sensors shown in the referenced patents. Each pulse 12, 14 and 16 rises abruptly from a baseline 18. For example, pulse 12 starts at point 20, rises suddenly to point 22, decays gradually to point 24 and drops abruptly to point 26. The process is repeated for a pulse 14 which starts at point 28. The decay time for the pulses 12, 14 and 16 is typically on the order of several seconds.

FIG. 1 further includes a threshold voltage $V_0$ shown as line 34. The pulses 12, 14 and 16 have a decay rate which indicates that the magnetic field detector is not in the region of a search object. Dashed lines for pulses 36 and 38 indicate respective reduced and increased decay times relative to the pulse 14. These pulses, either 36 or 38, indicate that the magnetic field detector has passed over a search object which has changed the relative magnetic fields at the two sensors within the magnetic field detector. The line 34 intersects the pulse 36 at a point 40, the pulse 14 at a point 42 and the pulse 38 at a point 44.

The time between the start point 28 of pulse 36 to the crossover point 40 is labelled $t_1$. The time from the start point 28 to the crossover point 42 of pulse 14 is labelled $t_2$.

A circuit in accordance with the present invention is illustrated in FIG. 2. The circuit in FIG. 2 includes a comparator 50 and an integrator 52. The combination of the comparator 50 and the integrator 52 is termed a Delayed Quasi Minimum (DQM) timer. The output from the DQM timer is shown in FIG. 3.

The comparator 50 receives the magnetometer output signal 10 where it passes through a resistor 54 to the noninverting input of a differential amplifier 56. A resistor 58 is connected between a power terminal V+ and a potentiometer 60 wherein the resistance element of potentiometer 60 is connected between resistor 58 and the circuit ground. The threshold voltage $V_0$ produced at the wiper of potentiometer 60 and provides the inverting input to the differential amplifier 56. The output of amplifier 56 is a detected signal which is transmitted through a line 62 to the integrator 52.

In the integrator 52 the line 62 is connected to the noninverting input of a differential amplifier 68. The V+ terminal is connected through a resistor 70 to the inverting input of amplifier 68. A capacitor 72 is connected between the output and the inverting input of differential amplifier 68. The output of the integrator 52 is produced at a line 74 which is the output of differential amplifier 68.

The output signal at line 74 is illustrated in FIG. 3. This comprises the output of the DQM timer. This output comprises pulses 78, 80 and 82 which correspond respectively in time to respective pulses 12, 14 and 16. All of these pulses are measured from a baseline 84. Pulse 78 starts from a point 86 and rises essentially linearly to a point 88 and drops along an essentially linear line to a point 90. Pulse 80 starts at a point 92 and rises to a point 94 then drops to a point 96. Pulse 82 has a similar configuration to previous pulses 78 and 80.

FIG. 3 includes a reference line 98 for a voltage reference $V_I$ and line 100 for a voltage reference $V_I'$. The line 98 is at the peak points of pulse 78, 80 and 82.

For a pass over of a search object, the pulse 80 reaches a peak at a point 106 and drops along a dashed line 108 to a point 110. The peak point 106 correspond to the voltage level $V_I'$ shown by line 100.

The method and apparatus of the present invention is now described in reference to the figures. The pulses 12, 14 and 16 represent beat frequency decay maxima for the situation in which the magnetic field detector has not passed over a search object which would alter the magnetic field in the region of the detector. The dashed lines for pulse 36 and 38 represent maxima decay periods for the situation in which the magnetic field detector has passed over a search object that has altered the magnetic field in the region of the detector. The following description is presented on the assumption that pulse 36 is the altered maxima decay pulse. The no search object situation is represented by pulse 14. The threshold level for comparator 50 is the voltage level $V_0$ illustrated by line 34. This reference voltage is the inverting input to the differential amplifier 56. When the signal 10 exceeds the threshold voltage $V_0$ the detected signal at line 62 is driven to a high voltage state. When the signal 10 is less than the threshold voltage $V_0$, the detected signal at line 62 is driven to a low voltage state. Thus, the detected signal is a bi-level signal as a result of the very high gain of amplifier 56. The detected signal at line 62 is illustrated in FIG. 4. Pulses 62a, 62b and 62c are detected pulses corresponding to integrated pulses 78, 80 and 82 which in turn correspond to beat frequency pulses 12, 14 and 16. Pulse edges 62d and 62e correspond to beat frequency pulses 36 and 38.

The detected signal at line 62 is integrated by operation of the integrator 52. When the detected signal is in the high voltage state the integrator 52 produces an essentially linear voltage increase shown by the rising portion of pulse 78. At point 88 the pulse 12 drops below the threshold voltage $V_0$ and the detected signal at line 62 goes to a low voltage state. Under this condition the output of the integrator 52 rapidly declines from point 88 to point 90 where it reaches a minimum at the baseline 84. The rate of decline is a function of the impedance of resistor 70. This process is repeated similarly for pulses 14 and 16 to produce corresponding pulses 80 and 82.

When a magnetic field detector passes over a search object and produces the pulse 36, the pulse 80 reaches a peak at point 106. At this point the output of integrator 52 declines along line 108 from point 106 to point 110. Thus, in the presence of a search object the pulse produced by integrator 52 has a substantially lower amplitude. The time period for the positive integration of pulses 78, 80 and 82 is proportional to the beat frequency maxima time width period, as shown by crossing the threshold line 34 in FIG. 1. The amplitudes of the pulses produced by the integrater 52 are proportional to the maxima time widths of the magnetometer output signal 10. Thus, the amplitudes of these integrated pulses are indicative of the change in magnetic fields at the magnetic field detector which in turn indicates the presence or absence of a search object in the region of the detector.

In a typical application of the present invention, the output signal at line 74 is recorded on a chart recorder where the change in amplitude of the integrated pulses, above or below a long term norm, serves to indicate the detection of an object in the search field of the magnetic field detector.

Although one embodiment of the invention has been illustrated in the accompanying drawings and described in the foregoing Detailed Description, it will be understood that the invention is not limited to the embodiment disclosed, but is capable of numerous rearrangements, modifications and substitutions without departing from the scope of the invention.

I claim:

1. A magnetometer circuit for use in a magnetic field detector having polarizable bodies in spaced apart relation, each body having a coil wound thereabout for receiving periodic polarizing current pulses, the coils connected to detector circuitry for producing a beat frequency signal having a response pulse following each of the current pulses, each response pulse having a maximum time width related to the difference in magnetic fields at the bodies, the circuit comprising:

means for threshold detecting said beat frequency signal pulses to produce a detected signal having a first state when said beat frequency signal pulse exceeds a selected threshold voltage and having a second state when said beat frequency signal pulse is less than said threshold voltage, and means for producing respective output pulses for said first states of said detected signal, each said output pulse having an amplitude corresponding to the duration of the corresponding first state of said detected signal for producing constant amplitude output pulses to indicate a no-target background and for producing output pulses having a different amplitude from that of said constant amplitude to indicate detection of the target by said magnetometer circuit.

2. The magnetometer circuit recited in claim 1 wherein said means for threshold detecting comprises a comparator having said threshold voltage as a first input and said beat signal pulses as a second input and producing said detected signal at the output thereof.

3. The magnetometer circuit as recited in claim 1 wherein said means for producing output pulses comprises an integrator circuit for integrating said detected signal and producing an integrated output signal having pulses corresponding to said beat frequency signal pulses.

4. A magnetometer circuit for use in a magnetic field detector having polarizable bodies in spaced apart relation, each body having a coil wound thereabout for receiving periodic polarizing current pulses, the coils connected to detector circuitry for producing a beat frequency signal having a response pulse following each of the current pulses, each response pulse having a maximum time width related two differences in magnetic fields at the bodies, circuit comprising:
   a first differential amplifier having an inverting input and a noninverting input;
   a first resistor having a first terminal connected to receive said beat signal and a second terminal connected to the noninverting input of said first amplifier;
   a second resistor having a first terminal connected to a fixed voltage node;
   a potentiometer having the resistance element thereof connected between a second terminal of said second resistor and a circuit common point and having a wiper thereof connected to the inverting input of said first differential amplifier wherein a threshold voltage is produced at said wiper;
   a second differential amplifier having an inverting input and a noninverting input, the output of said first differential amplifier connected to the noninverting input of said second differential amplifier;
   a third resistor connected between said fixed voltage node and the inverting input of said second differential amplifier; and
   a capacitor connected between the output and inverting input of said second differential amplifier wherein the output signal from said second differential amplifier is the integral of the output of said first differential amplifier and the amplitude of pulses in said output signal from said second differential amplifier is indicative of the presence or absence of search objects in the region of said detector.

5. A method for determining the periods of beat frequency maxima in a magnetic field detector having polarized bodies in spaced apart relation, each body having a coil wound thereabout for receiving periodic polarizing current pulses, the coils connected to detector circuitry for producing a beat frequency signal having a response pulse following each of the current pulses, each response pulse having a maximum time width related to the differences in magnetic fields at said bodies, comprising the steps of:
   threshold detecting said beat frequency signal to produce a bi-level detected signal, and
   producing respective output pulses for each occurrence of a selected state of said detected signal, said output pulses having an amplitude corresponding to the duration of the corresponding occurrence of said selected state in said detected signal,
   producing a sequence of said output pulses having a constant amplitude to indicate a no-target condition, and
   producing at least one of said output pulses having an amplitude different from said constant amplitude to indicate detection of a target.

6. The method recited in claim 5 wherein the step of threshold detecting comprises comparing said beat frequency signal to a selected threshold voltage to produce a detected signal having a first voltage state when said beat frequency signal exceeds said threshold voltage and has a second voltage state when said beat frequency signal is less than said threshold voltage.

* * * * *